(12) United States Patent
Suzuki et al.

(10) Patent No.: US 7,476,065 B2
(45) Date of Patent: Jan. 13, 2009

(54) PRINTED BOARD DRILLING METHOD AND PRINTED BOARD MACHINING APPARATUS

(75) Inventors: Nobuhiko Suzuki, Ebina (JP); Katsuhiro Nagasawa, Ebina (JP)

(73) Assignee: Hitachi Via Mechanics, Ltd., Kanagawa-Ken (JP)

( * ) Notice: Subject to any disclaimer, the term of this patent is extended or adjusted under 35 U.S.C. 154(b) by 227 days.

(21) Appl. No.: 11/139,588

(22) Filed: May 31, 2005

(65) Prior Publication Data

US 2005/0265797 A1    Dec. 1, 2005

(30) Foreign Application Priority Data

Jun. 1, 2004    (JP) ............................... 2004-163693
May 18, 2005   (JP) ............................... 2005-145855

(51) Int. Cl.
*B23B 35/00*    (2006.01)

(52) U.S. Cl. ........................... 408/1 R; 408/13; 408/67; 408/95; 700/169

(58) Field of Classification Search .................. 408/11, 408/51, 53, 67, 95, 97, 1 R, 8, 10, 13, 98, 408/704, 202; 700/169, 192; 409/131, 132
See application file for complete search history.

(56) References Cited

U.S. PATENT DOCUMENTS

| | | | | | |
|---|---|---|---|---|---|
| 3,973,863 | A | * | 8/1976 | Smith | ........................... 483/55 |
| 4,088,417 | A | * | 5/1978 | Kosmowski | ................. 408/1 R |
| 4,340,326 | A | * | 7/1982 | Buonauro et al. | ............. 408/16 |
| 4,765,784 | A | * | 8/1988 | Karwan | ......................... 408/13 |
| 4,813,825 | A | * | 3/1989 | Kosmowski | ................. 408/98 |
| 4,922,603 | A | * | 5/1990 | Kosmowski | ................. 483/56 |
| 5,024,562 | A | * | 6/1991 | Arai et al. | .................... 408/1 R |
| 5,087,156 | A | * | 2/1992 | Kanaya et al. | .............. 408/1 R |
| 5,090,847 | A | * | 2/1992 | Gelston, II | .................... 408/16 |
| 5,094,574 | A | * | 3/1992 | Nishigai et al. | ............. 409/132 |
| 5,123,789 | A | * | 6/1992 | Ohtani et al. | ............... 408/1 R |
| 5,139,376 | A | * | 8/1992 | Pumphrey | .................... 408/1 R |
| 5,212,391 | A | * | 5/1993 | Wachli | ..................... 250/559.4 |
| 5,293,048 | A | * | 3/1994 | Skunes et al. | .......... 250/559.29 |
| 5,308,198 | A | * | 5/1994 | Pumphrey | .................... 408/1 R |

(Continued)

FOREIGN PATENT DOCUMENTS

JP    61164758 A  *  7/1986

(Continued)

*Primary Examiner*—Daniel W Howell
(74) *Attorney, Agent, or Firm*—Wenderoth, Lind & Ponack, L.L.P.

(57) ABSTRACT

A printed board drilling method and a printed board machining apparatus capable of improving machining quality, such as improving positional accuracy of holes and true roundness of machined holes, and improving work efficiency by minimizing a runout of the tip of a drill. An extension of the drill extending out of a spindle when the drill is held by the spindle is defined in advance per type or mode of use of each drill. One drill is selected among a plurality of drills corresponding to a shape of holes to be drilled in the printed board and the spindle holds the drill so that the selected drill extends out of the spindle by the extension corresponding to the selected drill. Then, the move of the spindle with respect to the printed board is controlled and the selected drill is rotationally driven by the spindle to drill the printed board.

11 Claims, 8 Drawing Sheets

U.S. PATENT DOCUMENTS

| | | | | |
|---|---|---|---|---|
| 5,404,021 A | * | 4/1995 | Mangano et al. | 250/559.29 |
| 5,441,474 A | * | 8/1995 | Morofuji | 483/55 |
| 5,472,298 A | * | 12/1995 | Mihai | 408/13 |
| 5,876,156 A | * | 3/1999 | Yamaura et al. | 408/95 |
| 6,015,249 A | * | 1/2000 | Sacchetti | 409/186 |
| 6,309,151 B1 | * | 10/2001 | Sacchetti | 409/131 |
| 7,252,462 B2 | * | 8/2007 | Suzuki et al. | 408/95 |

FOREIGN PATENT DOCUMENTS

| | | | |
|---|---|---|---|
| JP | 63300807 A | * | 12/1988 |
| JP | 2002307220 A | * | 10/2002 |

* cited by examiner

| STORAGE AREA | TOOL NO. | DIAMETER OF TOOL (mm) | NUMBER OF REVOLUTIONS OF SPINDLE (rpm) | CUTTING SPEED (mm/min) | LIFE OF TOOL (NUMBER OF HOLES) | EXTENSION A (mm) |
|---|---|---|---|---|---|---|
| 1 | 1 | 0.2 | 250,000 | 2.4 | 2000 | 12 |
| 2 | 1 | 0.2 | 250,000 | 2.4 | 2000 | 12 |
| 3 | 2 | 1.8 | 35,000 | 0.7 | 1000 | 20 |
| 4 | 3 | 0.1 | 300,000 | 1.5 | 2000 | 12 |
| ⋮ | ⋮ | ⋮ | | ⋮ | ⋮ | ⋮ |
| n | m | 0.3 | 150,000 | 2.25 | 2500 | 20 |

| STORAGE AREA | TOOL NO. | DIAMETER OF TOOL (mm) | NUMBER OF REVOLUTIONS OF SPINDLE (rpm) | CUTTING SPEED (mm/min) | LIFE OF TOOL (NUMBER OF HOLES) |
|---|---|---|---|---|---|
| 1 | 1 | 0.2 | 250,000 | 2.4 | 2000 |
| 2 | 1 | 0.2 | 250,000 | 2.4 | 2000 |
| 3 | 2 | 1.8 | 35,000 | 0.7 | 1000 |
| 4 | 3 | 0.1 | 300,000 | 1.5 | 2000 |
| ⋮ | ⋮ | ⋮ | | ⋮ | ⋮ |
| n | m | 0.3 | 150,000 | 2.25 | 2500 |

PRINTED BOARD DRILLING METHOD AND PRINTED BOARD MACHINING APPARATUS

BACKGROUND OF THE INVENTION

1. Field of the Invention

The present invention relates to a printed board drilling method and a printed board machining apparatus for machining holes in a printed board by using drills.

2. Description of Related Art

The size of holes drilled in a printed board are required to be highly accurate in the depth direction. Japanese Patent No. 2559788 discloses a machining apparatus that calculates a distance between a head of a pressure foot and the tip of a tool in advance of machining and controls a feed distance of a spindle head based on that distance. This technology will be explained below.

Figure 5:
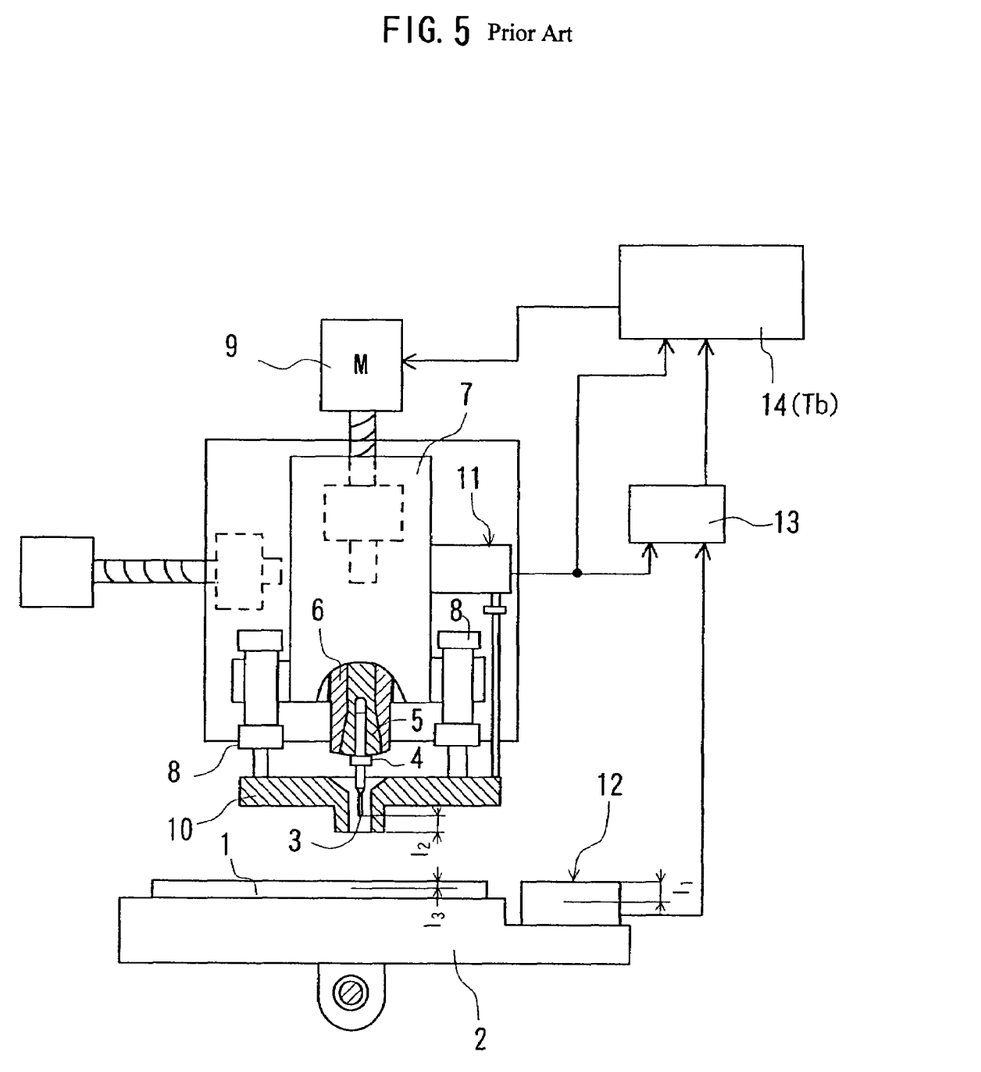
FIG. 5 is a front section view of a main part of a conventional printed board machining apparatus.

FIG. 5 is a front section view of a main part of the conventional printed board machining apparatus.

As shown in FIG. 5, a printed board 1 is fixed on a table 2. A ring 4 is attached around a drill 3. The drill 3 is rotatably held by a spindle 6 through an intermediary of a collet 5. An edge of the collet 5 forms one and same plane with a head of the spindle 6. A spindle head 7 supports the spindle 6 as well as a pair of air cylinders 8. The spindle head 7 is movable in the vertical direction in FIG. 5 by means of a servo motor 9. The height of the head of the spindle 6 from the surface of the table 2 is known in advance.

A pressure foot 10 is supported by rods of the air cylinders 8 and is urged downward in FIG. 5 by the air cylinders 8. First detecting means 11 disposed between the spindle head 7 and the pressure foot 10 detects a relative movement (distance) between the spindle head 7 and the pressure foot 10.

Second detecting means 12 fixed on the table 2 detects the position of the tip (edge) of the drill 3 (from the surface of the table 2, subtracting a length $l_1$ from the surface of the table 2 when the surface of the second detecting means 12 protrudes by the length $l_1$). The first detecting means 11 and the second detecting means 12 are connected with a calculating circuit 13. A control circuit 14 is connected with the first detecting means 11 and the calculating circuit 13 and controls the servo motor 9.

Next, operations of the conventional printed board machining apparatus will be explained.

In replacing the drills, the control unit 14 positions a new drill 3 above the second detecting means 12 and lowers the spindle head 7 by a distance defined in advance.

The spindle head 7 continuously descends even after when the head of the pressure foot 10 abuts against the second detecting means 12 and stops to move. The first detecting means 11 detects the relative movement between the spindle head 7 and the pressure foot 10. When the spindle head 7 stops after descending by a predetermined distance, the second detecting means 12 detects the position where the tip of the drill 3 has reached, i.e., the height of the tip of the drill 3 from the surface of the table 2.

The control unit 14 calculates a distance $l_2$ from the tip of the drill 3 to the head of the pressure foot 10 from a difference between the relative movement of the spindle head 7 and the pressure foot 10 and the position where the drill 3 has reached. Then, the control unit 14 adds a machining depth $l_3$ specified in advance with the distance $l_2$ and sets the relative movement of the spindle head 7 and the pressure foot 10 necessary for machining as a feed distance.

During machining, the control unit 14 compares the distance of the relative movement of the spindle head 7 and the pressure foot 10 when the pressure foot 10 abuts against the printed board 1 with the feed distance and when they become equal, stops or reverses the rotation of the servo motor 9.

Because the control unit 14 thus detects the distance from the tip of the drill 3 held by the spindle head 7 to the head of the pressure foot 10 and controls the movement of the drill 3 from the start of the relative movement of the spindle head 7 and the pressure foot 10 to the end of machining based on the distance and the preset machining depth, it has been possible to drill accurately up to the machining depth $l_3$ defined in advance.

Figure 6:
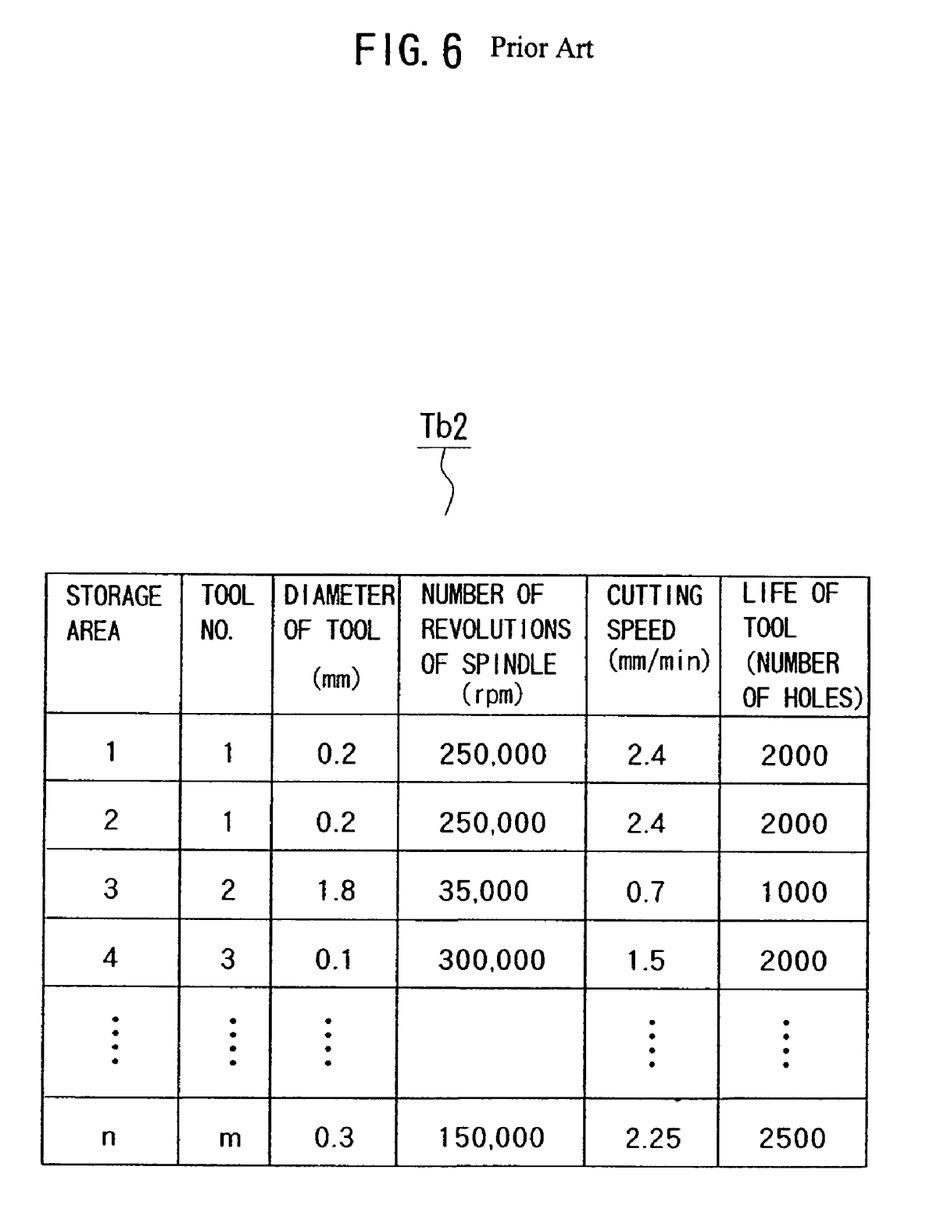
FIG. 6 is a table showing stored contents of a record of a conventional tool data table.

FIG. 6 is a table showing stored contents of record of conventional tool data. Inputted in the tool data table Tb2 stored within the control unit 14 are the Storage Areas (normally tools are stored one by one) of tools, i.e., drills in this case, Tool No., Diameter of Tool, Number of Revolution of Spindle, Cutting Speed and Life of Tool (allowable number of holes to be drilled) for example. As shown in the table, Tool No. identifies the diameter of the tool and each of the tools is specified by Storage Area.

Several thousands to several tens of thousands holes are drilled often in one printed board. Accordingly, a tool cassette for holding a plurality (several hundreds) of tools is disposed at one end of the table for mounting a printed board and holes of 0.1 to 6.5 mm for example are drilled by one printed board machining apparatus while replacing the tools in accordance to a tool holding command issued based on a machining program or the life of tools.

Presently, two kinds of drills having a shank of 3.175 mm and 2.00 mm in diameter are commercially sold for the printed board machining apparatus. A total length of the drill having the shank of 3.175 mm in diameter is 38.1 mm and that of the drill having the shank of 2.00 mm in diameter is 31.75 mm, regardless of their nominal diameter (diameter of cutting edge).

Figure 7A:
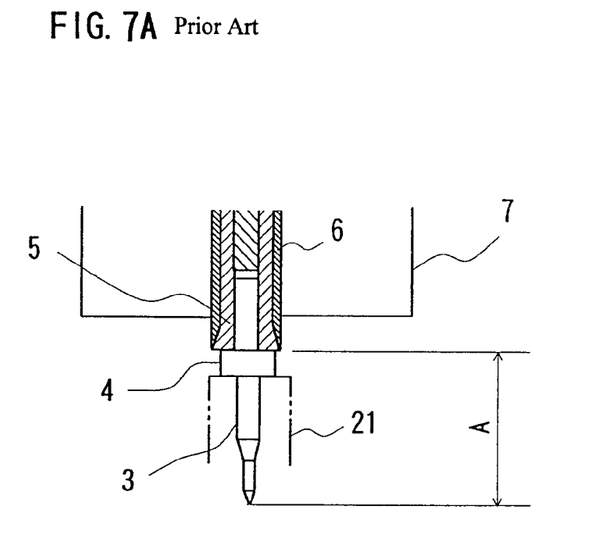
FIGS. 7A through 7C explain conventional methods for holding drills.
Figure 7B:
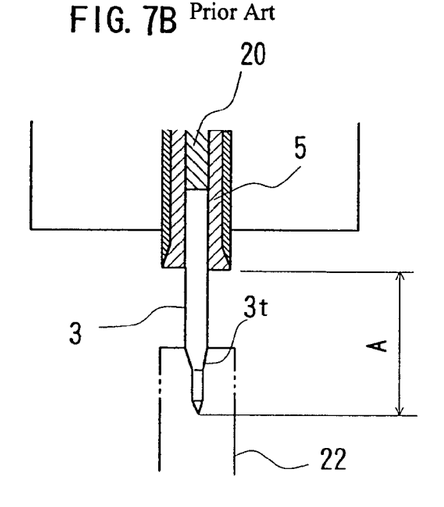
Figure 7C:
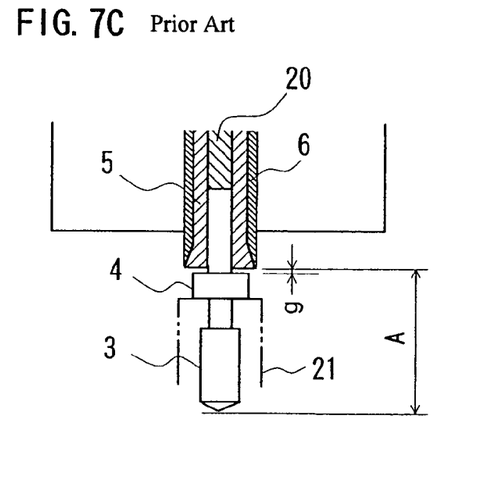

FIGS. 7A through 7C explain conventional methods for holding the drill.

A first conventional method uses the ring 4 made of synthetic resin. The ring 4 is attached to the shank of the drill 3 so that a distance from its end face, i.e., the head of the spindle, to the tip of the drill 3 becomes equal to a drill extension (hereinafter referred to as 'extension') A defined in advance as shown in FIG. 7A. The drill 3 attached with the ring 4 is held by a supply discharge post 21 shown by two dotted lines so as to allow the collet 5 to hold its shank.

A second conventional method is to position the drill 3 by abutting the rear end thereof to an end face of a stopper 20 within the collet 5 while holding its tapered face $3t$ in a supply discharge post 22 as shown in FIG. 7B. The stopper 20 is positioned so that the extension becomes equal to A, i.e., the extension of the drill 3 held by the collet 5 is A. It is noted that when the nominal diameter of the drill is larger than that of the shank, the drill is held in the supply discharge post 21 while attaching the ring 4 to the shank in the same manner with the first method as shown in FIG. 7C. However, it is the same with the method in FIG. 7B in that the drill is positioned by abutting its rear end to the stopper. In this case, a gap g (g>0) is formed between the ring 4 and the head of the spindle 6.

That is, the drill extension is set constant in every case regardless of the nominal diameter of the drills. It makes it easy to control the height of the tip of the drill to the surface of the workpiece when moving the drill 3 in the horizontal direction from the spot just machined to a next machining spot.

By the way, needs for drilling holes of very small diameter is increasing lately. In order to drill the holes of very small diameter, a spindle must be rotated at high-speed and a high-speed spindle (e.g., more than 300,000 revolutions/min.) has been put into practical use.

Figure 8:
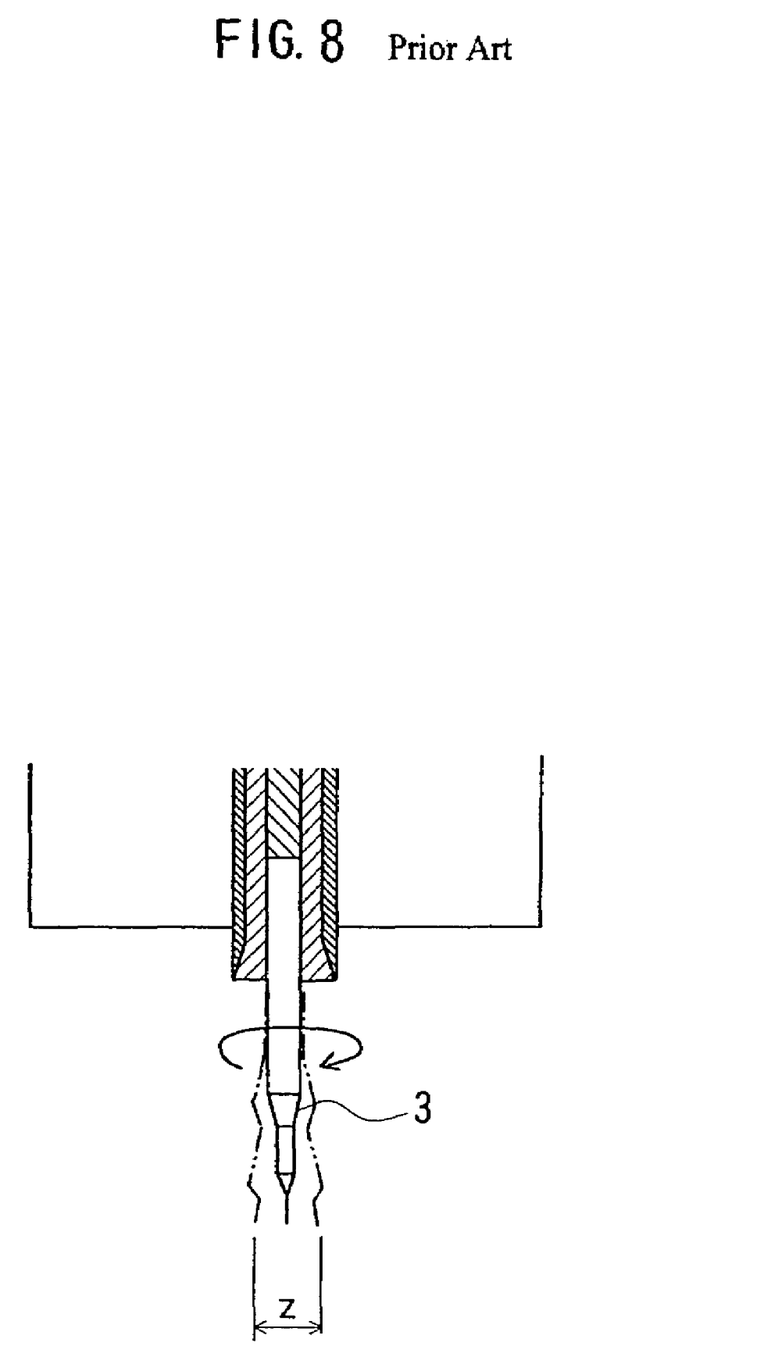
FIG. 8 explains a runout of the tip of a drill.

However, the higher the speed of the spindle, the more a runout z of the tip of the drill increases often as shown in FIG. 8. When the runout z of the tip of the drill becomes significant, not only the machining quality such as positional accuracy of holes and true roundness of drilled holes degrade but also the machining efficiency drops because drills are apt to be broken.

BRIEF SUMMARY OF THE INVENTION

It is therefore an object of the invention to solve the aforementioned problems by providing a printed board drilling method and a printed board machining apparatus that are capable of improving the machining quality and work efficiency by minimizing the runout of the tip of the drill.

According to a first aspect of the invention, there is provided a method for drilling holes in a printed board, having steps of selecting one drill corresponding to a shape of holes to be drilled in the printed board among a plurality of drills including those of different types or different modes of use, holding the selected drill by a spindle, and controlling a move of the spindle with respect to the printed board and rotationally driving the selected drill by the spindle.

This above-mentioned method further includes defining, in advance, an extension of each drill extending out of the spindle, when holding the drill by the spindle, per type or mode of use of each drill, and selecting one drill among the plurality of drills and holding the selected drill so that the selected drill extends out of the spindle by the extension corresponding to the selected drill.

Preferably, the height of the spindle with respect to the upper face of the table is determined based on the predetermined extension so that a distance between the upper face of the table for mounting the printed board and the tip of the drill becomes equal to a predetermined distance even when any drill is selected from among the plurality of drills when moving the drill held by the spindle in the horizontal direction with respect to the printed board.

The extension defined in advance may be determined based on a flute length of the drill or its nominal diameter.

According to a second aspect of the invention, there is provided a printed board machining apparatus having a plurality of drills including those of different types or different modes of use, and a spindle for rotatably holding one drill. Further, according to the second aspect of the invention, the printed board machining apparatus includes drill selecting and attaching means for selecting one drill corresponding to a shape of holes to be drilled in a printed board among the plurality of drills and for causing the spindle to hold the drill, and spindle moving means for controlling a move of the spindle with respect to the printed board, and drilling holes in the printed board by controlling the move of the spindle and by rotationally driving the drill held by the spindle.

In addition, the second aspect of the invention includes extension storage means for recording and storing the extension of each drill extending out of the spindle when the drill is held by the spindle per type or mode of use of each drill, wherein the drill selecting and attaching means reads the extension corresponding to the selected drill from the extensions recorded and stored in the extension storage means and causes the spindle to hold the drill so that the drill extends by the read extension when selecting the drill from the plurality of drills and causing the spindle to hold the drill.

Preferably, the printed board machining apparatus further includes a pressure foot, provided around the spindle and the drill held by the spindle, for pressing the vicinity of a hole to be drilled. Further, the printed board machining apparatus includes pressure foot positioning means for positioning the pressure foot so that a distance between the head of the pressure foot and the tip of the drill becomes equal to a predetermined distance even when any drill is selected among the plurality of drills, and sets a depth of the hole to be drilled by a feed distance of the spindle to the pressure foot when drilling holes in the printed board.

Preferably, the pressure foot positioning means positions the pressure foot so that the distance between the head of the pressure foot and the tip of the drill becomes equal to the predetermined distance when moving the drill in the horizontal direction from the position where machining has been finished to a next machining spot.

The pressure foot may be composed of a body and a head bush that can be attached to the body and which is pressed in contact with the vicinity of the hole to be drilled when drilling holes in the printed board, the head bush may be provided per shape corresponding to the extension of the drill extending out of the spindle and bush replacing means may be provided to replace with a head bush of the corresponding shape in accordance to the extension of the drill.

Preferably, the pressure foot includes the body having a spindle engaging hole portion slidably engaging with an outer peripheral face of the spindle, a storage space for storing the spindle when the spindle is forwarded, and an inner peripheral portion forming the storage space and having a suction port through which the storage space can be connected to suction means and a drill extension hole portion through which the drill can be extended. The inner peripheral portion of the body is formed so as to have a diameter larger than that of the outer peripheral face of the spindle to create a gap between the outer peripheral face of the spindle and the inner peripheral portion even when the spindle is stored.

The spindle may have abutting position setting means for freely setting position where an end of a holding side of the drill abuts and the extension of the drill extending out of the spindle may be set by setting the position where the end of the holding side of the drill abuts by the abutting position setting means.

Because the runout of the tip of the drill is practically proportional to the extension, the runout of the tip of the drill may be minimized by shortening the extension corresponding to the type and mode of use of each drill such as those whose nominal diameter is small or which are rotated at high-speed. As a result, the machining accuracy and machining efficiency may be improved.

Additional objects and advantages of the invention will be apparent from the following detailed description of a preferred embodiment thereof, which are best understood with reference to the accompanying drawings.

DETAILED DESCRIPTION OF THE INVENTION

Modes for carrying out the invention will be explained below in connection with first through third embodiments.

First Embodiment

Figure 1A:
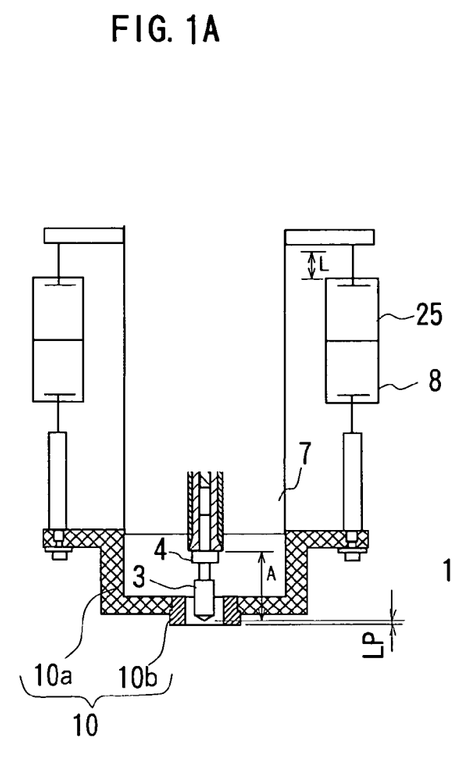
FIGS. 1A and 1B are front views showing a main part of a printed board machining apparatus of the invention.
Figure 1B:
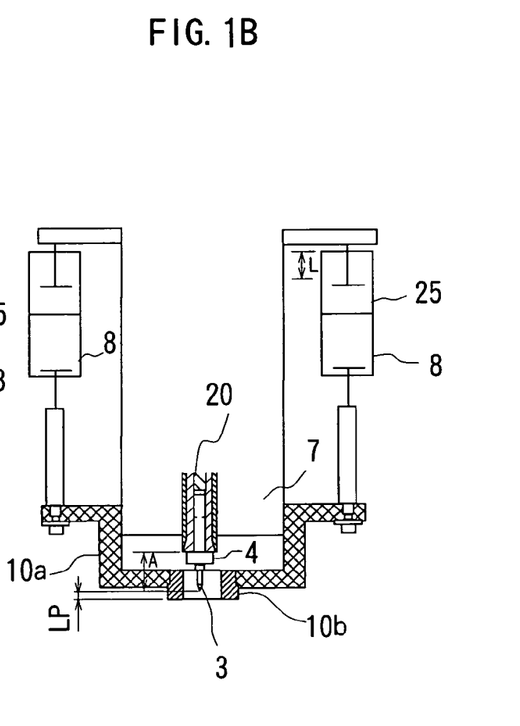
Figure 2:
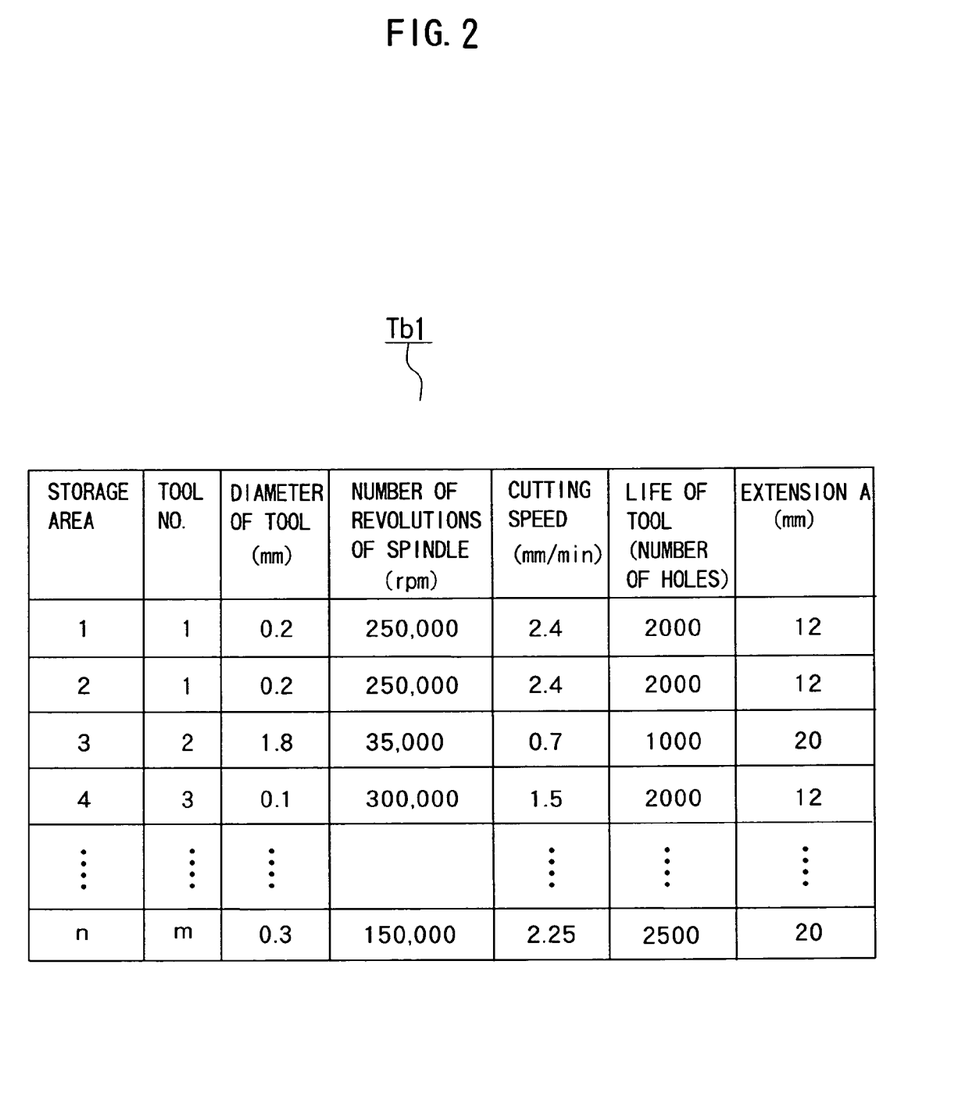
FIG. 2 is a table showing stored contents of record of a machining condition data table of the invention.

FIGS. 1A and 1B are front views showing a main part of a printed board machining apparatus of the invention and FIG. 2 is a table showing stored contents of record of a machining condition data table of the invention. It is noted that the same components or functions as those in FIG. 5 are denoted by the same reference numerals and an overlapping explanation thereof will be omitted here.

As shown in FIGS. 1A and 1B, a spindle head (spindle moving means) 7 supports a first cylinder (pressure foot positioning means) 8 through an intermediary of a second cylinder (pressure foot positioning means) 25. A pressing force of the second cylinder 25 is fully greater than that of the first cylinder 8. A stroke of the second cylinder 25 is L (8 mm here).

A pressure foot 10 is composed of a body 10a and a head bush 10b that is removably attached to the body 10a.

As shown in FIG. 2, data showing Extension A per type and mode of use of drills is added to a tool data table (extension storage means) Tb1 stored within a control unit 14 (see FIG. 5) in addition to data in the conventional tool data table Tb2 (see FIG. 6). As shown in the table, the extension A is set at 12 mm when the nominal diameter (tool diameter) is 0.2 mm or less and is set at 20 mm when the nominal diameter exceeds 0.2 mm in the present embodiment. It is noted that normally a flute length is 5 mm or more in case of a drill whose nominal diameter is 0.3 mm, the flute length is about 4 mm in case of a drill whose nominal diameter is 0.2 mm, and the flute length is less than 3 mm in case of a drill whose nominal diameter is 0.1 mm. It is noted that the data shown in the table in FIG. 2 is just exemplary data and the invention is not limited to such data.

Operations of the invention will be explained below.

It is noted that in the present embodiment, a ring 4 is attached to a shank of the drill 3 such that a distance from its end face to the tip of the drill 3 becomes equal to the predetermined drill extension A as shown in FIG. 1.

By being instructed to hold the drill, the control unit (drill selecting and attaching means) 14 refers to the tool data table Tb1 to obtain the extension A of the specified drill. Then, after replacing the drill, it carries out machining while extending a rod of the second cylinder 25 as shown in FIG. 1A when the extension A is 20 mm. It is noted that the tip of the drill is positioned above the head of the pressure foot by a distance LP in this case.

It carries out machining by contracting the rod of the second cylinder 25 as shown in FIG. 1B when the extension A of the specified drill is 12 mm. The tip of the drill is positioned above the head of the pressure foot by the distance LP also in this case.

It is noted that when the extension A of the drill is 12 mm, a servo motor 9 is controlled so that a distance between the tip of the drill and the surface of the printed board when moving from a certain machining spot to a next machining spot becomes equal to that of the case shown in FIG. 1A. Thereby, it becomes possible to prevent an air-cut time from increasing.

Still more, the control unit 14 controls the spindle head 7 based on the extension A in the tool data table Tb1 to determine the height of the spindle 6 to the upper face of the table 2 so that a distance between the upper face of the table 2 for mounting the printed board 1 and the tip of the drill 3 becomes equal to a predetermined distance at any time even when any drill 3 is selected.

It is noted that although the position of the head of the pressure foot 10 to the spindle head 7 is changed corresponding to the extension A of the drill in the present embodiment, it is also possible to prepare the head bush 10b having a different thickness (differs by 8 mm in this case) and to provide a head bush replacing device to replace the bush corresponding to the extension A, instead of providing the second cylinder 25. In this case, the control unit 14 may control the spindle head 7 so that the distance between the upper face of the table 2 and the edge of the head bush 10b becomes equal to the predetermined distance when moving the drill 3 in the horizontal direction with respect to the printed board 1.

The extension A may be changed just by changing the position for attaching the ring 4 to the drill 3 when the drill extension A is set by means of the ring as described above.

Second Embodiment

Next, a case of setting the drill extension A by means of a stopper (abutting position setting means) 20 within the spindle head will be explained.

In setting the drill extension A by means of the stopper 20, position of the stopper 20 must be changed corresponding to the extension A of the specified drill.

In this case, the stopper 20 may be arranged so as to be movable in the axial direction or a member movable in the radial direction may be provided axially in front of the end face of the stopper 20 within the collet. The drill extension A may be shortened by moving the movable member to position the drill and the drill extension A may be prolonged by abutting the rear end of the drill against the stopper.

The invention is applicable also to a conventional spindle because the position of the stopper needs not to be changed by providing a drill whose whole length is short.

Third Embodiment

Figure 3:
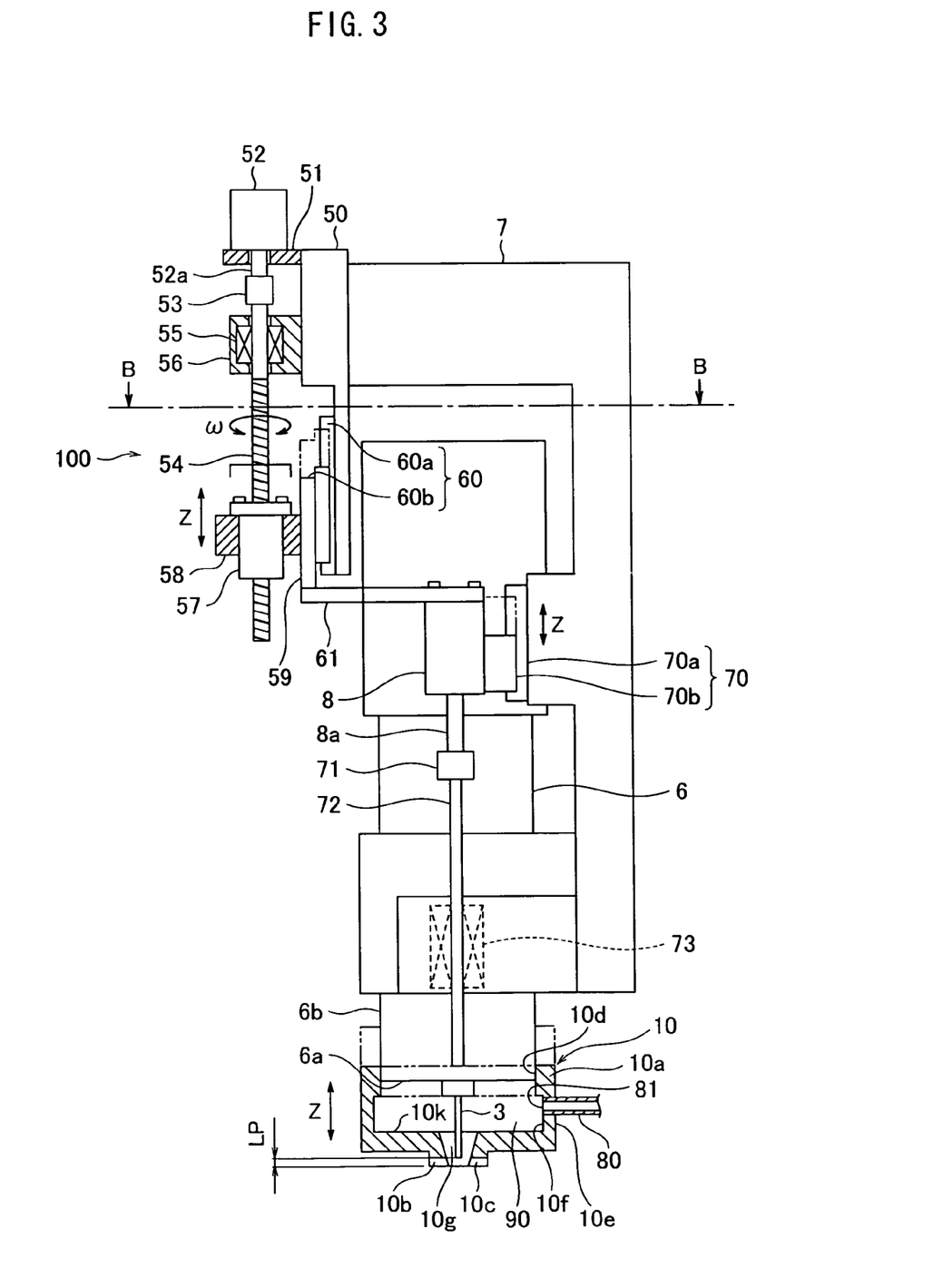
FIG. 3 is a side view of a main part of a printed board machining apparatus according to a third embodiment of the invention.
Figure 4:
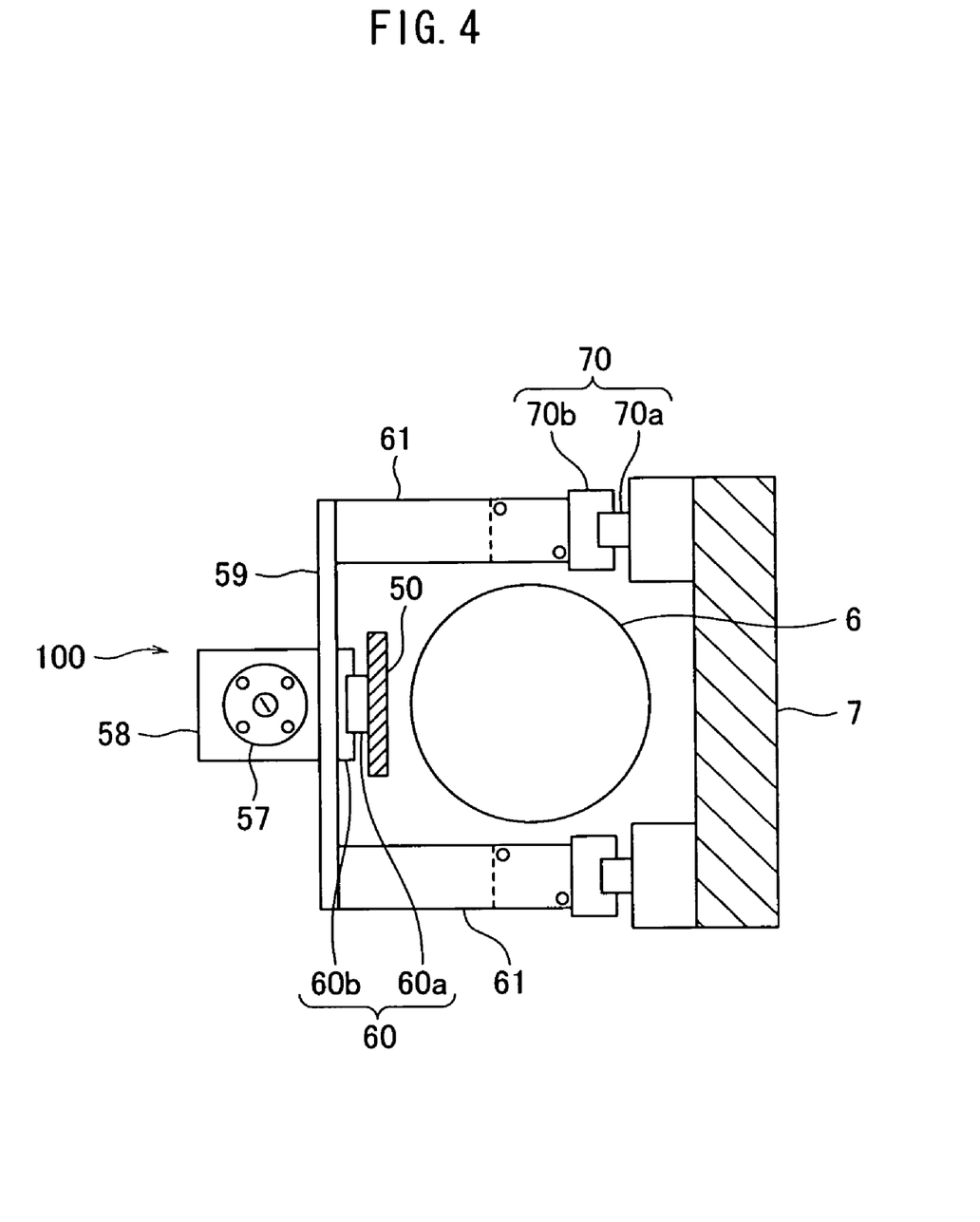
FIG. 4 is a section view taken along B-B in FIG. 3.

A third embodiment which is a partial modification of the first and second embodiments described above will be explained in succession with reference to FIGS. 3 and 4. FIG. 3 is a side view of the main part of the printed board machining apparatus according to the third embodiment of the invention and FIG. 4 is a section view taken along B-B in FIG. 3. It is noted that the same components with those in the first and second embodiments are denoted by the same reference numerals and an explanation thereof will be omitted here.

The printed board machining apparatus of the third embodiment has a guide mechanism (pressure foot positioning means) 100 instead of the second cylinder 25 described above. Still more, the pressure foot 10 is partially changed and is connected with a vacuum source (suction means) not shown through an intermediary of a joint 80 and a suction port 81 provided therein.

The guide unit 100 is composed of a base 50, a servo motor 52, a ball thread 54, a ball nut 57, link members, i.e. a nut seat 58, a link bar 59 and a bar 61, and others and freely moves the components from the first cylinder 8 (referred to simply as "air cylinder" hereinafter) to the pressure foot 10 in the vertical direction by means of first and second linear guide units 60 and 70. The printed board machining apparatus of the present embodiment will be explained below in detail.

The base 50 is fixed to the spindle head 7. The servo motor 52 is supported on a motor seat 51 fixed at the upper end of the base 50. The control unit 14 controls a rotational angle of the servo motor 52 in the direction of arrow ω. The servo motor 52 is supported by the motor seat 51 so that an axial line of an output shaft 52a thereof runs in parallel with an axial line of the drill 3.

The ball thread 54 is connected with the output shaft 52a of the servo motor 52 through an intermediary of a coupling 53. The ball thread 54 is rotatably supported by a bearing 55. The bearing 55 is supported by the base 50 through an intermediary of a support seat 56. The ball nut 57 mating with the ball thread 54 is held by a nut seat 58. The nut seat 58 is fixed to the link bar 59.

A track 60a of the first linear guide unit 60 composed of the track 60a and a bearing 60b is fixed to the base 50 so that it runs in parallel with the axial line of the drill 3. The link bar 59 is supported by the bearing 60b. One end (left end) of a pair of bars 61 is fixed to the lower end of the link bar 59. The air cylinder 8 is fixed to the other end of the bar 61.

A track 70a of the pair of second linear guide units 70 composed of the track 70a and a bearing 70b, respectively, is fixed to the spindle head 7 so that it runs in parallel with the axial line of the drill 3.

Each of the air cylinders 8 is supported by the bearing 70b. A piston rod 8a of the air cylinder 8 is connected to one end of a rod 72 through an intermediary of a joint 71. The rod 72 is supported by a bearing 73 movably in the vertical direction in the figure. The pressure foot 10 is connected with the other end of the rod 72.

Having the structure as described above, the guide unit 100 can position the pressure foot 10 at arbitrary position in the axial direction of the drill 3 (in the vertical direction indicated by an arrow Z in FIG. 3) by rotating the servo motor 52. Accordingly, it allows the extension to be set in multiple steps corresponding to types and modes of use of the drills.

Meanwhile, the pressure foot 10 is composed of the body 10a and the head bush 10b as described above. The body 10a is formed into a shape of a column having an outer peripheral face 10e and has a spindle engaging hole portion 10d that slidably engages with an outer peripheral face 6b of the spindle 6 at the upper part thereof. A gap between the spindle engaging hole portion 10d and the outer peripheral face 6b of the spindle 6 is very small, e.g., around 0.5 mm in diameter.

The pressure foot 10 has a storage space therein formed by an inner peripheral face (inner peripheral portion) 10f and a bottom part 10k thereof. The storage space 90 stores an extended part of the spindle 6 when the spindle 6 is moved downward. Still more, a joint 80 connected with a vacuum source not shown penetrates through and is secured from the outer peripheral face 10e to the inner peripheral face 10f so as to form a suction port 81 at the inner peripheral portion 10f.

The inner peripheral face 10f is formed so as to have a diameter larger than that of the spindle engaging hole portion 10d, i.e., to have the diameter larger than that of the outer peripheral face 6b of the spindle 6. Thereby, when the spindle 6 is forwarded and is stored in the storage space 90, there is a gap between the outer peripheral face 6b of the spindle 6 and the inner peripheral face 10f. The pressure foot 10 is provided also with a drill extension hole portion 10g for passing and extending the drill 3 during machining through the bottom portion 10k.

During machining, chips produced during machining are blown up by air flowing into the storage space 90 of the pressure foot 10 from a groove 10c provided at the head bush 10b through the drill extension hole portion 10g and are discharged quickly to the outside from the storage space 90 via the suction port 81 and the joint 80. The dust collecting performance may be improved by disposing the joint 80 (suction port 81) at the upper side of the space as much as possible so that the upper end of the suction port 81 contacts with the lower end 6a of the spindle 6 when the tip of the drill 3 reaches to the machining end.

However, when the drill extension A is shortened as described above in the invention, the lower end 6a of the spindle 6 comes closer to the bottom portion 10k of the pressure foot 10 specifically when the tip of the drill 3 reaches to the machining end. If there is no gap between the outer peripheral face 6b of the spindle 6 and the inner peripheral face 10f for example, the performance for discharging the chips degrades because the suction port 81 is closed by the spindle 6 here.

However, it becomes possible to prevent the suction port 81 from being closed and thereby to reduce the degradation of the dust collection performance even when the distance between the lower end 6a of the spindle 6 and the bottom portion 10k of the pressure foot 10 is very small by constructing the pressure foot 10 so that the inner peripheral face 10f has the diameter larger than that of the outer peripheral face 6b of the spindle 6 to create the gap therebetween even when the spindle 6 is forwarded (when the spindle 6 is stored therein).

It is noted that the cases of changing the extensions A in the two steps, e.g., 12 mm and 20 mm, have been explained in the embodiments described above, the invention is not limited to that and extensions of finer steps may be set corresponding to types and modes of use of drills.

Still more, the case of applying the invention to the printed board machining apparatus having the pressure foot 10 has been explained in the embodiments, the invention is also applicable to a printed board machining apparatus having no pressure foot.

While the preferred embodiments have been described, variations thereto will occur to those skilled in the art within the scope of the present inventive concepts which are delineated by the following claims.

What is claimed is:

1. A method for drilling holes in a printed board using a selected drilling element held by a spindle, the method comprising:

selecting a drilling element corresponding to a diameter of a hole to be drilled in the printed board, the drilling element being selected from a plurality of drilling elements, each drilling element of the plurality of drilling elements having a different nominal diameter and being identified by a different number of revolutions of the spindle while drilling with the drilling element;

holding the selected drilling element by the spindle;

controlling a movement of the spindle with respect to the printed board;

rotationally driving the selected drilling element using the spindle holding the selected drilling element; and setting in advance, for each drilling element, a corresponding extension length, which is a length that each drilling element is to extend out of the spindle when held by the spindle, each corresponding extension length of each respective drilling element being set according to a nominal diameter of the respective drilling element and a number of revolutions of the spindle while drilling with the respective drilling element, wherein said holding of the selected drilling element includes holding the selected drilling element so that the selected drilling element extends out of the spindle by the corresponding extension length.

2. The method for drilling holes in a printed board as described in claim 1, wherein:

a height of the spindle, in relation to an upper face of a table which supports the printed board mounted thereon, is determined, based on the corresponding extension length defined in advance by said setting in advance, so that a distance between the upper face of the table and a tip of the selected drilling element is equal to a predetermined distance; and the height of the spindle is determined when any drilling element is selected from the plurality of drilling elements, and is determined when moving the selected drilling element held by the spindle in a horizontal direction with respect to the printed board.

3. The method for drilling holes in a printed board as described in claim 2, wherein the corresponding extension length is also determined according to a flute length of the drilling element.

4. The method for drilling holes in a printed board as described in claim 1, wherein the corresponding extension length is also determined according to a flute length of the drilling element.

5. A printed board machining apparatus for drilling holes in a printed board, the printed board machining apparatus comprising:

a spindle for holding a selected drilling element;

drilling element selecting and attaching means for selecting a drilling element corresponding to a diameter of a hole to be drilled in the printed board, the drilling element being selected from a plurality of drilling elements, each drilling element of the plurality of drilling elements having a different nominal and being identified by a different number of revolutions of the spindle while drilling with the drilling element;

spindle moving means for drilling holes in the printed circuit board by controlling a movement of said spindle with respect to the printed board and by rotationally driving the selected drilling element by said spindle; and corresponding extension length storage means for recording and storing, for each drilling element, a corresponding extension length, which is a length that each drilling element is to extend out of said spindle when held by said spindle, each corresponding extension length of each respective drilling element being set according to a nominal diameter of the respective drilling element and a number of revolutions of the spindle while drilling with the respective drilling element, wherein said drilling element selecting and attaching means is operable to read the corresponding extension length, which corresponds to the selected drilling element, from the corresponding extension lengths recorded and stored in said corresponding extension length storage means, and to cause said spindle to hold the selected drilling element so that the selected drilling element extends out of said spindle by the corresponding extension length read by said drilling element selecting and attaching means.

6. The printed board machining apparatus as described in claim 5, further comprising:

a pressure foot, disposed around said spindle and around the selected drilling element held by said spindle, and for pressing on the printed board at a vicinity of the hole to be drilled in the printed board;

pressure foot positioning means for positioning said pressure foot so that a distance between a head of said pressure foot and a tip of the selected drilling element is equal to a predetermined distance, the positioning of said pressure foot occurring when any drilling element is selected from the plurality of drilling elements; and depth setting means for setting a depth of the hole to be drilled according to a feed distance, which is a distance between said spindle and said pressure foot when drilling holes in the printed board.

7. The printed board machining apparatus as described in claim 6, wherein said pressure foot positioning means is further for positioning said pressure foot so that the distance between the head of said pressure foot and the tip of the selected drilling element is equal to the predetermined distance when moving the selected drilling element in a horizontal direction with respect to the printed board, from a location where the drilling has finished, to a next drilling location.

8. The printed board machining apparatus as described in claim 6, wherein:

said pressure foot includes a body and a head bush configured to be attached to said body and to be pressed in contact with the printed board at the vicinity of the hole to be drilled;

said head bush is provided based on a shape of said head bush which corresponds to the corresponding extension length of the selected drilling element; and said printed board machining apparatus further includes bush replacing means for replacing said head bush with a head bush corresponding to the corresponding extension length of the drilling element.

9. The printed board machining apparatus as described in claim 6, wherein:

said pressure foot includes:

a body having a spindle engaging hole portion arranged to slidably engage an outer peripheral face of said spindle;

a storage space for storing said spindle when said spindle is extended; and an inner peripheral portion forming said storage space and having a suction port through which said storage space is configured to connect to suction means, and having a drill extension hole portion through which the selected drilling element is to extend; and said inner peripheral portion of said body includes a diameter larger than the outer peripheral face of said spindle to form a gap between the outer peripheral face of said spindle and the inner peripheral portion when said spindle is stored.

10. The printed board machining apparatus as described in claim 5, wherein:

said spindle includes abutting position setting means for setting a position at which a rear end of the selected drilling element abuts said spindle; and the corresponding extension length of the selected drilling element is set according to the position set by said abutting position setting means.

11. The printed board machining apparatus as described in claim 5, wherein said printed board machining apparatus includes the plurality of drilling elements.

* * * * *